(12) United States Patent
Maker (10) Patent No.: US 7,286,972 B2
(45) Date of Patent: Oct. 23, 2007

(54) IMPLICIT-EXPLICIT SWITCHING FOR FINITE ELEMENT ANALYSIS

(75) Inventor: Bradley N. Maker, Danville, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 690 days.

(21) Appl. No.: 09/836,490

(22) Filed: Apr. 17, 2001

(65) Prior Publication Data

US 2002/0177983 A1     Nov. 28, 2002

(51) Int. Cl.
*G06G 7/64*     (2006.01)

(52) U.S. Cl. .............................................. 703/7; 703/2
(58) Field of Classification Search ............... 703/2, 703/7
See application file for complete search history.

(56) References Cited

U.S. PATENT DOCUMENTS

| | | | |
|---|---|---|---|
| 5,379,227 A * | 1/1995 | Tang et al. ................... | 700/98 |
| 5,609,342 A * | 3/1997 | Peterson et al. ............. | 277/399 |
| 6,295,464 B1 | 9/2001 | Metaxas ....................... | 600/407 |
| 6,353,768 B1 * | 3/2002 | Karafillis et al. ............. | 700/97 |
| 6,478,991 B1 * | 11/2002 | Mancosu et al. ........... | 264/40.1 |
| 6,560,570 B1 | 5/2003 | Dohrmann et al. | |
| 6,678,642 B1 | 1/2004 | Budge | |
| 6,785,640 B1 | 8/2004 | Lu et al. | |
| 2002/0077795 A1 * | 6/2002 | Woods et al. ................. | 703/6 |

OTHER PUBLICATIONS

LS-DYNA Keyword User's Manual, May 1999, Livermore Software Technology Corporation, Version 950, pp. I.1-12; 7.28-29; 18.6-9.*
ABAQUS/Answers, Summer 1999, Hibbitt, Karlsson & Sorensen, Inc., pp. 1-4.*
ABAQUS/Answers, Spring 1997, Hibbit, Karlsson & Sorensen, Inc., pp. 1-4.*
M. Feliziani and F. Maradei; An Explicit-Implicit Solution Scheme to Analyze Fast Transients by Finite Elements; Mar. 1997; IEEE Transactions on Magnetics, vol. 33. No. 2, pp. 1452-1455.*
Wang, Choudhry, and Wertheimer; Comparison between the static implicit and dynamic explicit methods for FEM simulation of sheet forming processes; 1997; pp. 1-6.*
Livermore Software Technology Corporation, LS-DYNA Keyword User's Manual, 1999, Version 950, numerous pages.*
J.G.J. Beijer and J.L. Spoormaker, Time Integration Strategies for FEM Analyses with Nonlinear Viscoelastic Polymers, 2000, Computational Techniques for Materials, Composites, and Composite Structures, pp. 15-26.*
J. L. Curiel Sosa, E. de Souza Neto, and D. R. J. Owen; "A combined implicit-explicit algorithm in time for non-linear finite element analysis"; 2005; John Wiley & Sons, Ltd.; pp. 63-75.*

(Continued)

*Primary Examiner*—Paul Rodriguez
*Assistant Examiner*—Jason Proctor
(74) *Attorney, Agent, or Firm*—Winston & Strawn LLP (57) ABSTRACT

A method for performing a finite element simulation. The method includes switching between an implicit method and an explicit method during the finite element simulation. By switching between the implicit and explicit methods during a simulation, an accurate solution can be obtained quickly and reliably.

43 Claims, 9 Drawing Sheets

OTHER PUBLICATIONS

Hughes, Thomas J.R., "The Finite Element Method: Linear Static and Dynamic Finite Element Analysis", Prentice Hall, 1987, 2000, pp. iii-682.

"LS-Dyna Keyword User's Manual, Nonlinear Dynamic Analysis of Structures", Livermore Software Technology Corporation, Version 950, May 1999.

Plimpton et al., "Transient Dynamic Simulations: Parallel Algorithms for Contact Detection and Smoothed Particle Hydrodynamics", IEEE, 1996.

LS_DYNA News, "An Information Letter for Users and Applications of LS-SYNA edited by the European LS-DYNA Distributor Group", Issue 3, Jan. 1999.

Stoker, "Development of the Arbitrary Langrangian-Eulerian Method in Non-Linear Solid Mechanics. Application to Forming Processes", University of Twente, Feb. 1999.

Antaki et al., "A Parallel Dynamic-Mesh Lagrangian Method for Simulation of Flows With Dynamic Interfaces", IEEE, 2000.

FEA Information Co., 3rd Issue, Dec. 9, 2000.

Benamou, "An Eulerian Numerical Method for Geometric Optics", Canum, 2000.

Guilkey et al., "An Implicit Time Integration Strategy for Use with the Material Point Method", Elsevier Science Ltd. 2001.

"LS-DYNA Keyword User's Manual, vol. 1", Livermore Software Technology Corporation, Version 960, May 2001.

FEA Information International News, Issue Mar. 2001.

Maker, "Implicit Springback Calculation Using LS-DYNA," Livermore Software Calculation Using LSDYNA, 5th International LS-DYNA Users Conference, Sep. 21-22, 1998, 1 page.

USPTO Office Action mailed in U.S. Appl. No. 10/081,387, filed Aug. 24, 2005, 14 pages.

USPTO Office Action mailed in U.S. Appl. No. 10/271,931, filed Jan. 11, 2006, 17 pages.

* cited by examiner

IMPLICIT-EXPLICIT SWITCHING FOR FINITE ELEMENT ANALYSIS

BACKGROUND OF THE INVENTION

1. Field of the Invention

The present invention relates generally to computer simulations using the finite element method, and more specifically, to a method for switching between the implicit finite element method and the explicit finite element method during a simulation.

2. Related Art

The finite element method is a technique for obtaining approximate numerical solutions to boundary value problems which predict the response of physical systems subjected to external loads. The finite element method is described in detail by Thomas J. R. Hughes in "The Finite Element Method" (1987), published by Prentice-Hall, Inc., New Jersey, which is incorporated herein by reference in its entirety. One common use of the finite element method is in the field of solid mechanics where it is used to analyze structural problems such as the formation of stamped sheet metal parts or the springback of stamped sheet metal parts.

In general, finite element analysis begins by generating a finite element model of a system. In this model, a subject structure is reduced into a number of node points which are connected together to form finite elements. Governing equations of motion are written in a discrete form, where the motions of each node point are the unknown part of the solution. A simulated load or other influence is applied to the system and the resulting effect is analyzed using well known mathematical methods.

Two such mathematical methods are the implicit finite element method ("the implicit method") and the explicit finite element method ("the explicit method"). These methods are used to solve transient dynamic equations of motion and thus obtain static equilibrium solutions to the equations. When obtaining the static equilibrium solutions, the effects of inertia are not included. Since the effects of inertia are not included, the implicit method can be used to solve the governing equations directly, but the explicit method can provide only approximate solutions. Conventional computer simulations are performed using either implicit method finite element software or explicit method finite element software.

The implicit method is characterized by the formation of a stiffness matrix to represent the interaction of nodal motions within the structure. In the implicit solution process, the stiffness matrix is assembled, its inverse is computed, and this inverse is applied to an array of nodal forces to produce a solution of nodal displacements. For nonlinear problems, these displacements are tested to verify that they satisfy the governing equations of motion. If the equations are not satisfied, an iterative procedure is applied to refine the accuracy of the solution. When a satisfactory solution is finally obtained, the iterative process is said to have converged. Successful convergence of these iterations is not guaranteed and can be very difficult in practice.

The implicit solution procedure can be described mathematically as follows: A statement of static equilibrium may be written as a balance of internal and external forces at each node point in the model $$f^{int}(u)=f^{ext}$$

where $f^{int}(u)$ and $f^{ext}$ are the discrete vectors of internal and external forces, and for brevity only $f^{int}$ is expressed as a function of the nodal displacement vector u. At each load step (time step) during the simulation, a displacement vector is sought which satisfies equilibrium according to the above equation. The equations describing this iterative search are obtained by performing a first order Taylor series expansion about the displacement solution at iteration (i+1), and moving known terms from iteration (i) to the right $$u^{(i+1)}=u^{(i)}+\Delta U$$

$$f^{int}(u^{(i)}=\Delta u)=f^{ext}$$

$$\frac{\partial f^{int}}{\partial u}(u^{(i)})\Delta u = f^{ext} - f^{int}(u^{(i)})$$

$$K(u^{(i)})\Delta u=R^{(i)}$$

where K represents the stiffness matrix of the structure, R represents the out-of-balance or residual force vector, and $\Delta u$ represents the increment or change in displacement which advances the solution from iteration (i) to iteration (i+1).

The solution is initialized for time step (n+1) using the equilibrium displacement solution from the previous time step (n)

$$u_{(n+1)}^{(0)}=u_{(n)}$$

The solution is then advanced iteratively by successively solving for the displacement increment, and then updating the total displacement $$\Delta u=K^{-1}(u^{(i)})R^{(i)}$$

$$u^{(i+1)}=u^{(i)}+\Delta u$$

When the correct equilibrium solution is found, both the residual force vector and the displacement increment become zero. Norms of these vectors are used to evaluate the accuracy of a solution during the iteration process, and to test for convergence of the equilibrium iterations. The product of displacement increment and residual force can be computed to give the incremental internal energy of the model, which can be monitored for excessive growth to detect divergence of the equilibrium iteration process.

An advantage of the implicit method is that a solution which satisfies static equilibrium can be computed directly. Another advantage of the implicit method is that there is no algorithmic limit to time step size. Loads can typically be applied in tens or hundreds of steps, rather than millions of steps.

A disadvantage of the implicit method is that a stiffness matrix must be formed and inverted. Assembling and inverting the stiffness matrix in a typical application requires a relatively large amount of computer CPU and memory resources. For example, in a typical automotive application, the dimensions of the stiffness matrix can be more than one million by one million. Another disadvantage of the implicit method is that convergence of the nonlinear equilibrium iteration process is not guaranteed. Successful convergence at each step of the solution requires proper choice of load step (time step), and good performance of the numerical models for material behavior and contact interaction between parts. Each simulation presents a new set of difficulties, so that reliable solutions are not always available even for expert users of the method.

The explicit method is based on a statement of dynamic equilibrium: force is equal to the product of mass and acceleration. This condition is applied independently at each node point. Thus, at each node point, forces are assembled, and the acceleration of each node is computed simply by dividing by nodal mass. This process is repeated as the solution is incrementally advanced in time, integrating the nodal accelerations to obtain velocity and displacement. In order for this solution to remain accurate, a limit is placed on the maximum size of the time step. This limit, known as the Courant condition, is typically less than one microsecond in automotive applications. This means that over one million time steps are often required to simulate one second of structural response.

The explicit solution procedure can be described mathematically as follows: A statement of dynamic equilibrium may be written as a balance between inertial, internal and external forces at each node point in the model $$Ma + f^{int}(u) = f^{ext}$$

where M is the nodal mass matrix, a is the nodal acceleration vector, and $f^{int}(u)$ and $f^{ext}$ are the discrete vectors of internal and external forces, and for brevity only $f^{int}$ is expressed as a function of the nodal displacement vector u. The solution is advanced by solving the above equation for the acceleration at time (n), and then applying the central difference method to obtain nodal velocity and displacement vectors $$v^{(n+1/2)} = v^{(n-1/2)} + a^{(n)} \Delta t$$

$$u^{(n+1)} = u^{(n-1)} + v^{(n+1/2)} \Delta t$$

The Courant condition provides a limit for the maximum stable time step $\Delta t$, which can be written as $$\Delta t < \frac{h}{c}$$

where h is the material sound speed, and c is the size of the smallest element in the model.

An advantage of the explicit method is that relatively small amount of computer CPU and memory resources are required, since a stiffness matrix is not used. Another advantage of the explicit method is that convergence is not a problem, since no equilibrium iterations are necessary.

A disadvantage of the explicit method is that static equilibrium can only be approximated. Another disadvantage of the explicit method is that the Courant time step size limit requires potentially hundreds of thousands of time steps to be computed during each simulation, which significantly slows the solution process. Yet another disadvantage of the explicit method is that techniques for accelerating the solution process, such as mass scaling, introduce artificial dynamic effects which are difficult to quantify and control.

As mentioned above, conventional simulations are performed using either implicit method finite element software or explicit method finite element software. However, simulations performed using implicit method finite element software suffer from the disadvantages of the implicit method mentioned above, and simulations performed using explicit method finite element software suffer from the disadvantages of the explicit method mentioned above.

Thus, what is needed is a method that overcomes the disadvantages of conventional finite element simulations.

SUMMARY OF THE INVENTION

The present invention includes a method that overcomes the disadvantages of conventional finite element simulations. The method accomplishes this by switching between an implicit method and an explicit method one or more times during a finite element simulation.

In one embodiment of the present invention, a method for performing a finite element simulation is disclosed. The method includes switching between an implicit method and an explicit method one or more times during the finite element simulation.

In another embodiment of the present invention, a computer readable storage medium storing one or more computer programs for performing a finite element simulation is disclosed. The computer programs include instructions for automatically switching between an implicit method and an explicit method one or more times during the finite element simulation.

In another embodiment of the present invention, a computer system is disclosed. The computer system includes one or more computers and one or more computer programs running on the computers where the computer programs are for performing a finite element simulation. The computer programs include computer instructions for automatically switching between an implicit method and an explicit method one or more times during the finite element simulation.

In another embodiment of the present invention, a data signal embodied in a carrier wave is disclosed. The data signal includes one or more computer programs for performing a finite element simulation. The computer programs include instructions for automatically switching between an implicit method and an explicit method one or more times during the finite element simulation.

Other embodiments, aspects, and advantages of the present invention will become apparent from the following descriptions, the accompanying drawings, and the accompanying claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 5 of the drawings. Like numerals are used for like and corresponding parts of the various drawings.

System Overview

Figure 1:
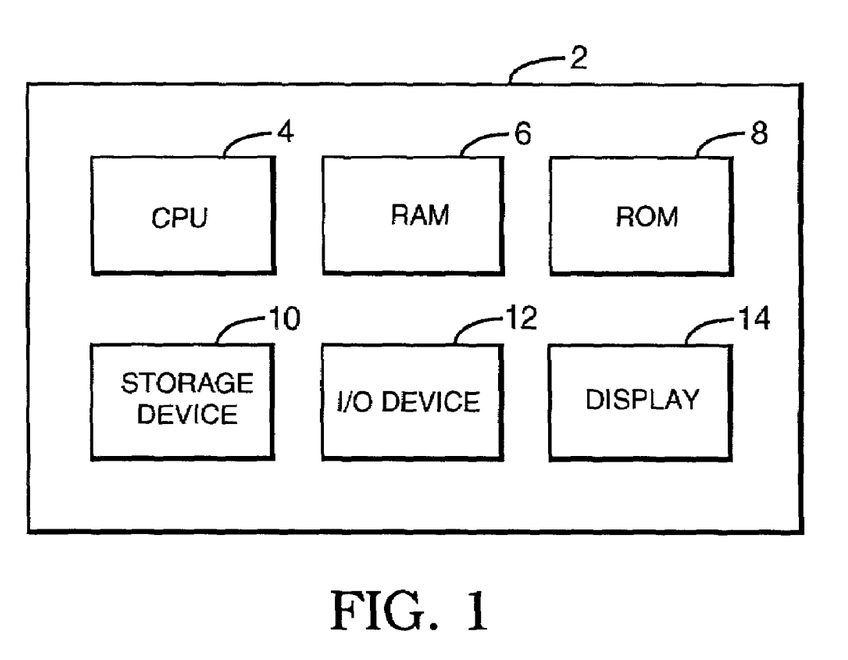
FIG. 1 is a block diagram of an exemplary computer system upon which the methods of the present invention can be performed, according to an embodiment of the present invention.

FIG. 1 is a block diagram of an exemplary computer system 2 upon which the methods of the present invention can be performed, according to an embodiment of the present invention. Computer system 2 can include one or more suitable processing facilities such as microcomputers/workstations, minicomputers, mainframes, and/or massively parallel processing computers running suitable operating systems. Examples of suitable microcomputers/workstations include the IBM PC from IBM Corporation of Armonk, N.Y., and the Sparc-Station from Sun Microsystems Corporation of Mountain View, Calif. Examples of suitable minicomputers are the VAX 750 from Digital Equipment Corporation of Maynard, Mass. and the AS/400 from IBM. An example of a suitable mainframe is the System-390 series from IBM. Examples of suitable massively parallel processing computers include the Cray T3E or the Cray T90 from Cray Corporation of Mendota Heights, Minn. Examples of suitable operating systems include any of the various versions of Unix, VMS from Digital Equipment, or OS/2 from IBM. Computer systems used in the development of the invention include the IBM RS-6000, the Hewlett-Packard V-Class, and the Silicon Graphics Origin 2000, all of which are engineering workstations or servers running under the UNIX operating system, as ported by each hardware vendor. Those skilled in the art will recognize that other types of suitable computer systems and suitable operating systems can be used in accordance with the present invention.

Computer system 2 includes the following components: a central processing unit (CPU) 4, a random access memory (RAM) 6, a read-only memory (ROM) 8, a storage device 10, an input/output (I/O) device 12, and a display 14. Although only a single instance of each component is shown, it should be recognized that computer system 2 can include one or more of any of the components shown in FIG. 1. Computer system 2 can also include other suitable computer components. For clarity, interconnections between the various components of computer system 2 are not shown.

CPU 4 can be any type of processor, such as a Pentium processor from Intel Corporation or an Alpha EV5 from Digital Equipment Corporation, used to process information in computer system 2.

RAM 6 can be any type of memory device, including dynamic and/or static RAM, used to store any number of different types of information required by computer system 2. For example, RAM 6 can store computer programs for performing the method of the present invention.

ROM 8 can be any type of read-only memory device, including PROMS, EPROMS and EEPROMs, used to store any number of different types of information required by computer system 2. For example, ROM 8 can store information concerning initialization routines or even some or all of the computer programs for performing the method of the present invention.

Storage device 10 can be any type of mass storage device, including magnetic, electrical, and optical-type storage devices, used to store any number of different types of information required by computer system 2. For example, storage device 10 can store various types of data or even some or all of the computer programs for performing the method of the present invention.

I/O device 12 can be any type of input/output device, including keyboards, printers, or any other type of device, by which information can be entered into or received from computer system 2.

Display 14 can be any type of display device, including those of the CRT and flat-panel display type, used to display information. For example, display 14 can display the results of a computer simulation, which results from performing the methods of the present invention, via a graphical user interface.

Implicit-Explicit Switching Overview

The implicit-explicit switching method of the present invention is a new approach to finite element simulation of the mechanical response of structures. By combining the existing implicit and explicit methods within a single simulation, and switching back and forth between them, an improved solution can be obtained. The solution is improved because the switching procedure avoids deficiencies in both the implicit and explicit methods, producing a solution free of dynamic effects and convergence difficulties.

The proposed implicit-explicit switching method is designed to avoid the problems of both methods while capitalizing on their advantages. It allows the robust, reliable explicit method to be used in support of the accurate, but less reliable implicit method. In the implicit-explicit switching method, the implicit method is generally employed initially, and continues to be used until convergence trouble is detected. At this point, the solution is switched and the explicit method is used to advance the solution past the troublesome spot. The solution then returns to the implicit method and proceeds, switching repeatedly back and forth as necessary to avoid any further convergence difficulties as they are encountered.

Convergence trouble is detected whenever the number of equilibrium iterations exceeds a threshold limit or when the internal energy of the system exceeds a threshold limit. With the implicit method alone, the simulation would be forced to terminate unsuccessfully at this point, or to back up in time and try to proceed with a smaller time step size. Instead, the implicit-explicit switching method of the present invention activates a switch to the explicit method, and proceeds reliably since in the explicit method successful convergence of equilibrium iterations is not required.

The power of the implicit-explicit switching method comes from the ability of a brief explicit simulation interval to circumvent the convergence difficulty which often halts implicit method simulations. Once the solution is switched back to the implicit method, static equilibrium iterations are resumed. Convergence is usually obtained easily, eliminating the inertial effects introduced during the explicit phase and re-establishing static equilibrium. In cases where convergence is not obtained, another switch to the explicit method is activated. The method continues switching until convergence can be regained with the implicit method.

The implicit-explicit switching method is further described below in the sections entitled "Automatic Switching" and "Manual Switching."

Automatic Switching

Figure 2:
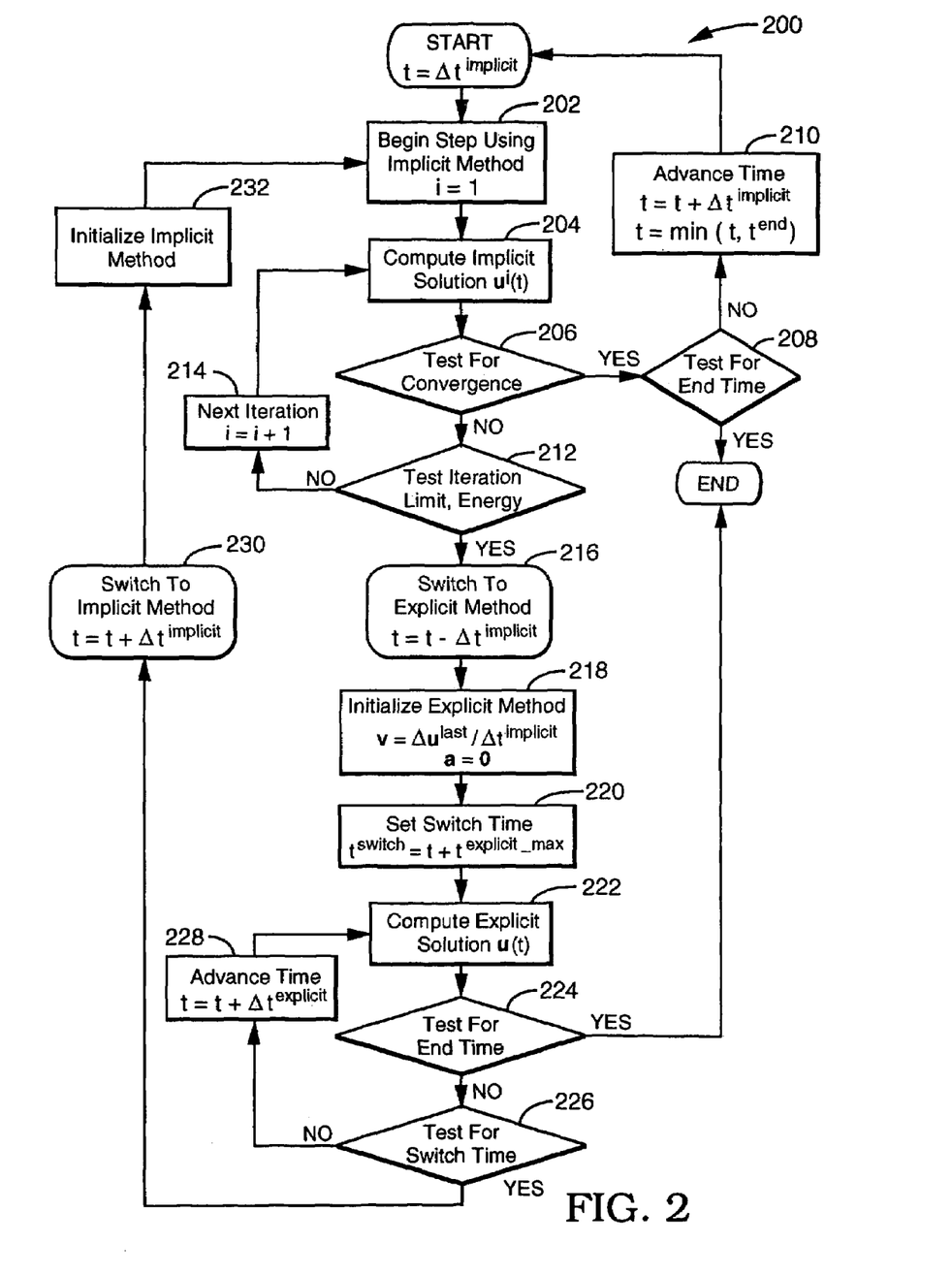
FIG. 2 is a flowchart of an exemplary automatic implicit-explicit switching method, according to an embodiment of the present invention.

FIG. 2 is a flowchart of an exemplary automatic implicit-explicit switching method 200, according to one embodiment of the present invention. Method 200 can be incorporated into a finite element analysis computer program, such as LS-DYNA produced by Livermore Software Technology Corporation, of Livermore, Calif. The computer program can be stored on a computer readable storage medium such as RAM 6, ROM 8, and/or storage device 10 of computer system 2, and performed on a computer such as computer system 2. The computer program can also be transmitted between two or more computers over a network in a data signal embodied in a carrier wave.

Before method 200 begins, a user defines several parameters. First, a user defines the implicit time step size $\Delta t^{implicit}$. Second, the user defines the explicit time step size $\Delta t^{explicit}$ which, as described above, is limited by the Courant condition. Third, the user defines the total simulation time tend. Fourth, the user defines the iteration limit $i^{max}$ and the maximum increase in internal energy $E^{max}$ for the implicit method. These values are defined such that convergence problems can be detected (as discussed below). Fifth, the user defines the maximum time the explicit method can operate $t^{explicit\_max}$. Sixth, the current time of the simulation t is set equal to the implicit time step size $\Delta t^{implicit}$.

In step 202, a simulation begins using the implicit method. At this time, an implicit method iteration counter is set to 1. In step 204, an implicit solution is computed. As described above, this is accomplished by assembling a stiffness matrix, which represents the interaction of nodal motions within the subject structure, computing the inverse of the stiffness matrix, and then applying this inverse to an array of nodal forces to produce a solution of nodal displacements $u^1(t)$. The solution of nodal displacements $u^i(t)$ defines the position of each node in the system due to the application of the nodal forces.

In step 206, the nodal displacements are tested to verify that they satisfy the governing equations of motion. If the equations of motion are satisfied (i.e., a satisfactory solution is obtained), the solution is said to have converged and method 200 advances to step 208. In step 208, the current time t is compared to the total simulation time $t^{end}$ defined by the user. If the current time t is equal to the total simulation time $t^{end}$, then method 200 ends. If the current time t is less than the total simulation time $t^{end}$, method 200 proceeds to step 210. In step 210, the current time t is incremented by the implicit time step size $\Delta t^{implicit}$ and method 200 proceeds to step 202.

Referring back to step 206, if the equations are not satisfied (i.e., a satisfactory solution is not obtained), method 200 proceeds to step 212. In step 212, the iteration limit $i^{max}$ and the maximum increase in internal energy $E^{max}$ for the implicit method are tested. A large number of iterations, or an excessive increase in internal energy, indicates that the solution may not converge or that the solution may take an unacceptable amount of time to converge. Both situations are undesirable.

The increase in internal energy is computed by comparing the internal energy of the model at the beginning of the current time step with the internal energy of the model at the end of the current iteration. The internal energy at the beginning of the current time step is the product of the force at the beginning of the current time step times the displacement at the beginning of the current time step. The internal energy at the end of the current iteration is the product of the force at the end of the current iteration times the displacement at the end of the current iteration. If the increase in internal energy exceeds the maximum increase in internal energy $E^{max}$ (which, for example, may be 1,000,000 times the initial internal energy), this indicates that the solution may not converge or that the solution may take an unacceptable amount of time to converge.

If neither the iteration limit $i^{max}$ nor the maximum internal energy $E^{max}$ has been exceeded, method 200 proceeds to step 214 where the current iteration i is incremented and method 200 then proceeds to step 204. If either the iteration limit $i^{max}$ or the maximum energy limit $E^{max}$ has been exceeded, method 200 proceeds to step 216.

In step 216, the simulation automatically switches from the implicit method to the explicit method. In this step, the current time t is reduced by the implicit time step size $\Delta t^{implicit}$ since the simulation during the previous implicit time step was unsuccessful.

In step 218, the explicit method is initialized. This is accomplished by initializing the position, velocity, and acceleration of each node in the system. The velocity and acceleration of each node in the system must be provided since the explicit method performs a dynamic (not static) simulation.

The position of each node in the system can be determined by using the position of each node point from the last successful implicit step. The last successful implicit step is the last step performed using the implicit method where neither the iteration limit $i^{max}$ nor the maximum energy limit $E^{max}$ were exceeded. The velocity and acceleration of each node in the system can be determined by several different techniques. Two such techniques are described below, although it should be recognized that other initialization techniques can be used in accordance with the present invention.

One technique for selecting the initial velocity and acceleration of each node point is to simply specify all values to be zero. This simple approach is intuitively appealing because the explicit dynamic method then begins with the model completely at rest, free from all dynamic oscillations. However, it was discovered that this approach can induce undesirable dynamic oscillations later in the explicit phase of the simulation. These oscillations occur because any further motion of a node point creates non-zero velocity, and this change in velocity creates an accompanying acceleration, introducing dynamic inertia effects.

Another technique by which the initial velocity and acceleration of each node point can be determined is by computing the velocity of each node point from the last successful implicit step, and defining the acceleration of each node point as zero. The initial velocity of each node is computed as the change in displacement over the last successful implicit step $\Delta u^{last}$, divided by the implicit time step size $\Delta t^{implicit}$ as follows:

$$v = \Delta u^{last} / \Delta t^{implicit}$$

If no prior successful implicit step exists, the initial velocity of each node is defined to be zero. Applicant has discovered that this technique reduces the dynamic error which is introduced into the explicit method, since further deformation of the model along the previous direction is possible without changing the nodal velocity, hence without introducing any acceleration nor any accompanying inertial effects. Once the initial velocity and acceleration of each node point has been determined, method 200 proceeds to step 220.

In step 220, the time when the solution will automatically switch back to the implicit method or the switch time $t^{switch}$ is computed. This time is computed by adding to the current time t a maximum time the explicit method can operate $t^{explicit\_max}$. After computing the switch time $t^{switch}$, method 200 proceeds to step 222.

In step 222, the simulation proceeds using the explicit method. As described above, the explicit method operates by assembling forces at each node point, determining the mass of each node point, and then dividing the forces at each node point by the mass of each node point to determine the acceleration of each node point. This information is then used to determine the solution of nodal displacements u(t), (i.e., the position of each node in the system).

In step 224, after an explicit solution has been obtained, method 200 checks to see if the end time $t^{end}$ has been reached. If the current time t is equal to the end time $t^{end}$, then method 200 ends. If the end time $t^{end}$ has not been reached, method 200 checks to see if the switch time $t^{switch}$ has been reached (step 226). If the switch time $t^{switch}$ has not been reached, method 200 increments the current time t (step 228) by the explicit time step size $\Delta t^{explicit}$ and proceeds to step 222 to perform another explicit solution. If the switch time $t^{switch}$ has been reached, method 200 proceeds to step 230.

In step 230, the simulation automatically switches from the explicit method to the implicit method. In this step, the current time t is incremented by the implicit time step size $\Delta t^{implicit}$.

In step 232, the implicit method is initialized. This is accomplished by initializing the position of each node in the system. The position of each node in the system is defined using the solution of nodal displacements u(t) from the last explicit step performed.

Method 200 then proceeds to step 202 where current iteration i is set to 1, then to step 204 where an iteration using the implicit method is performed, then to step 206 where it is determined whether or not a satisfactory solution has been obtained, and then to step 212 where it is determined whether the iteration limit $i^{max}$ or the maximum internal energy $E^{max}$ has or has not been exceeded. If neither the iteration limit $i^{max}$ nor the maximum internal energy $E^{max}$ has been exceeded, method 200 proceeds to step 214 where the current iteration i is incremented and method 200 then proceeds to step 204. If either the iteration limit $i^{max}$ or the maximum energy limit $E^{max}$ has been exceeded, method 200 proceeds to step 216 where the simulation automatically switches from the implicit method to the explicit method, and then to steps 218, 220, and 222, as described previously, where the simulation proceeds using the explicit method. This procedure continues until the simulation time is advanced to end time $t^{end}$, using a combination of implicit and explicit methods as necessary according to method 200.

Figure 3:
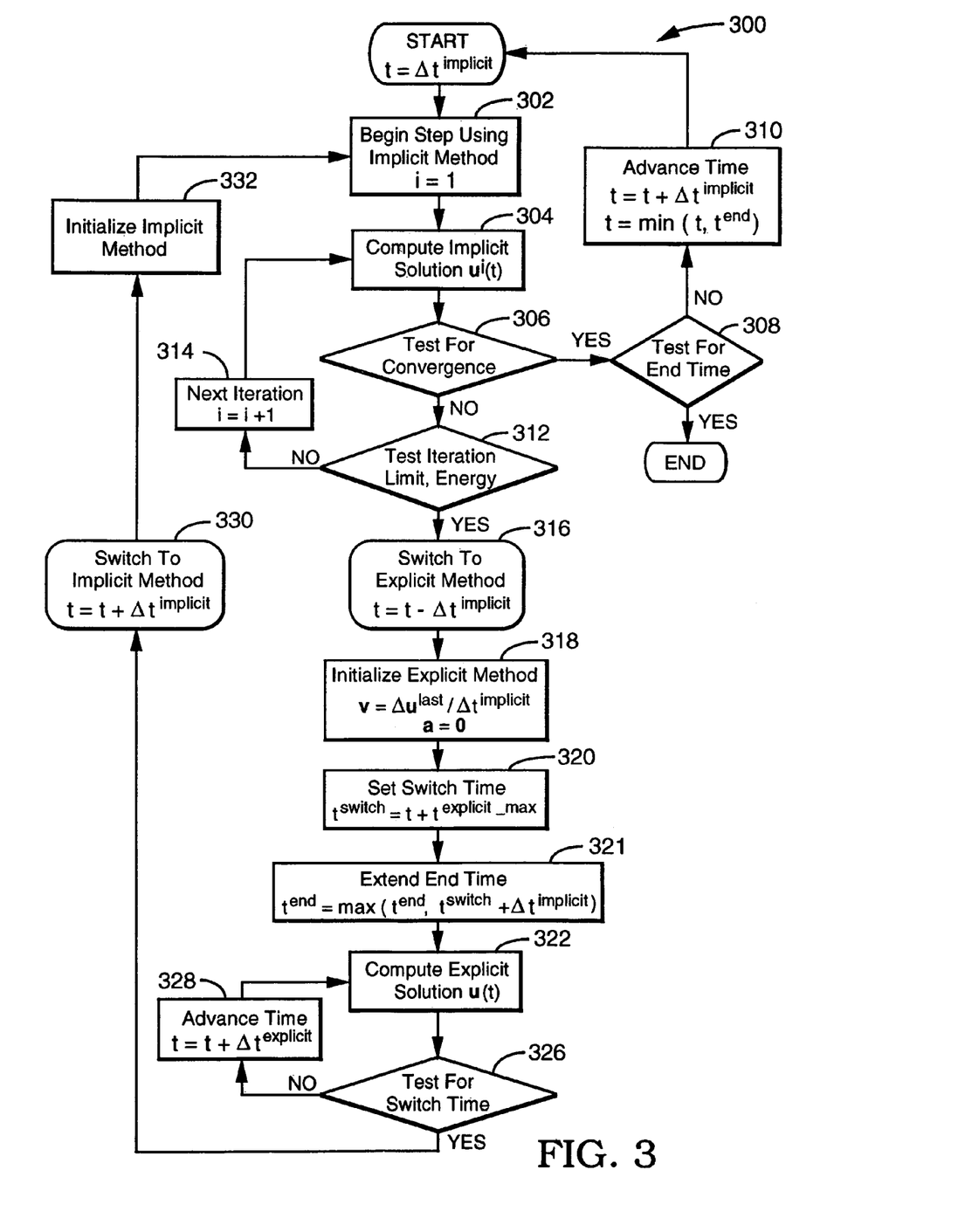
FIG. 3 is a flowchart of an exemplary automatic implicit-explicit switching method, according to an embodiment of the present invention.

FIG. 3 is a flowchart of an exemplary automatic implicit-explicit switching method 300, according to one embodiment of the present invention. Like method 200, method 300 can be incorporated into a finite element analysis computer program, such as LS-DYNA produced by Livermore Software Technology Corporation, of Livermore, Calif. The computer program can be stored on a computer readable storage medium such as RAM 6, ROM 8, and/or storage device 10 of computer system 2, and performed on a computer such as computer system 2. The computer program can also be transmitted between two or more computers over a network in a data signal embodied in a carrier wave.

Method 300 is a modification of method 200. Steps 302-320 and 326-332 of method 300 are performed in a manner similar to steps 202-220 and 226-232 of method 200. Method 300 is different from method 200 in that method 300 forces the final step of the simulation to be performed using the implicit method, whereas, according to method 200, the final step in the simulation can be performed using the implicit method (step 208) or the explicit method (step 224). Method 300 is useful in simulations that, to be accurate, require a static solution. For example, method 300 is useful for springback simulations.

Method 300 introduces a new step after step 320, where the switch time $t^{switch}$ has been computed. In the new step 321, the end time $t^{end}$ of the simulation is automatically extended beyond the switch time $t^{switch}$ by the duration of one implicit time step $\Delta t^{implicit}$. The end time $t^{end}$ of the simulation is extended to ensure that the switch time $t^{switch}$ will always be reached before the end time $t^{end}$ when the explicit method is in use, and allows the end time check to be removed from the explicit solution loop (see step 224 of method 200). In this way, the end time $t^{end}$ can only be reached from the implicit loop via steps 306 and 308, and thus the final step is guaranteed to be reached using the implicit method.

Manual Switching

Although methods 200 and 300 have described automatic implicit-explicit switching methods, the scope of the present invention also encompasses manual implicit-explicit switching methods. To perform a manual switching simulation, two parameters must be determined: the exact times to switch between the implicit and explicit methods and the number of times to switch between the methods. These parameters are obtained through a trial-and-error process. Generally, numerous erroneous simulations must be performed before acceptable parameters are found for a particular simulation and thus only simplistic switching schemes can be generated in a practical effort (e.g., only switching two or three times during a simulation). As a result, the manual switching method is typically only useful for simplistic simulations.

Exemplary Applications

Figure 4A:
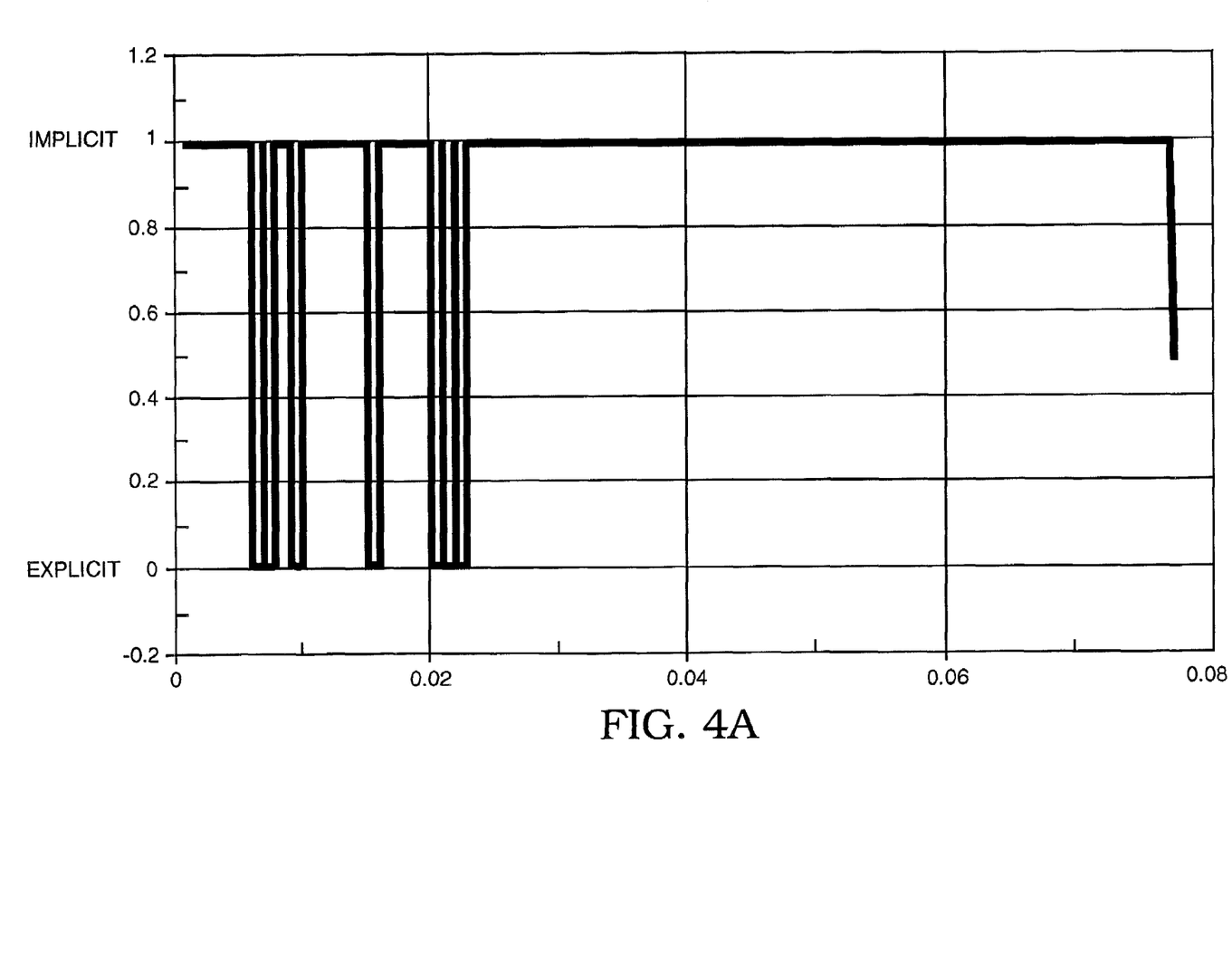
FIGS. 4A and 4B show a switching procedure that was automatically generated using a method of the present invention to solve a simulation of the formation of a Budd Complex Channel.

FIG. 4A shows a switching procedure that was automatically generated using method 200 of the present invention, as applied to a simulation of the formation of the Budd Complex Channel. The Budd Complex Channel is a well known benchmark part used in computer simulations. The solution method that is in use (i.e., either the implicit or explicit method) and the time step size used in each method is shown on the y-axis, and the elapsed time of the simulation t is shown on the x-axis. During the implicit phases of the simulation, the time step size is large (time step size=0.001 seconds) whereas during the explicit phases the Courant condition limits the time step size to a very small value ($1.8 \times 10^{-6}$ seconds).

The simulation begins at time t=0 using the implicit method. At time t=0.007 seconds the implicit method encounters convergence trouble After the number of iterations using the implicit method reaches the iteration limit $i^{max}$ or the maximum internal energy $E^{max}$, the simulation automatically switches to the explicit method. The simulation then proceeds for a brief, predetermined period of time (i.e., the explicit interval $t^{explicit\_max}$) using the explicit method, which in this example was provided as an input data value of 0.0005 seconds. Then the simulation automatically switches back to the implicit method. This process of automatically switching back and forth between the implicit and explicit methods continues until the simulation proceeds to the end time of 0.078 seconds. The size of the last implicit step is automatically adjusted to reach the end time exactly.

Figure 4B:
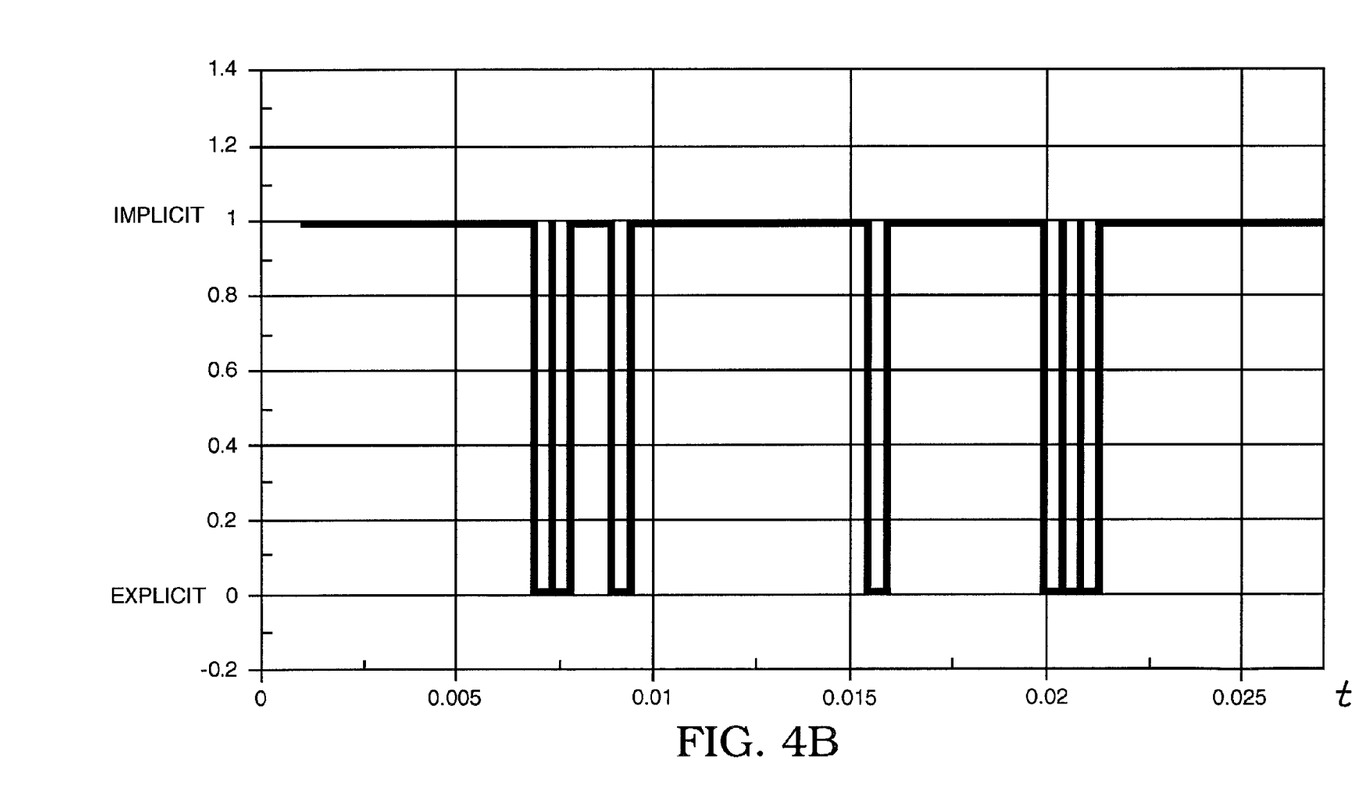
Figure 4C:
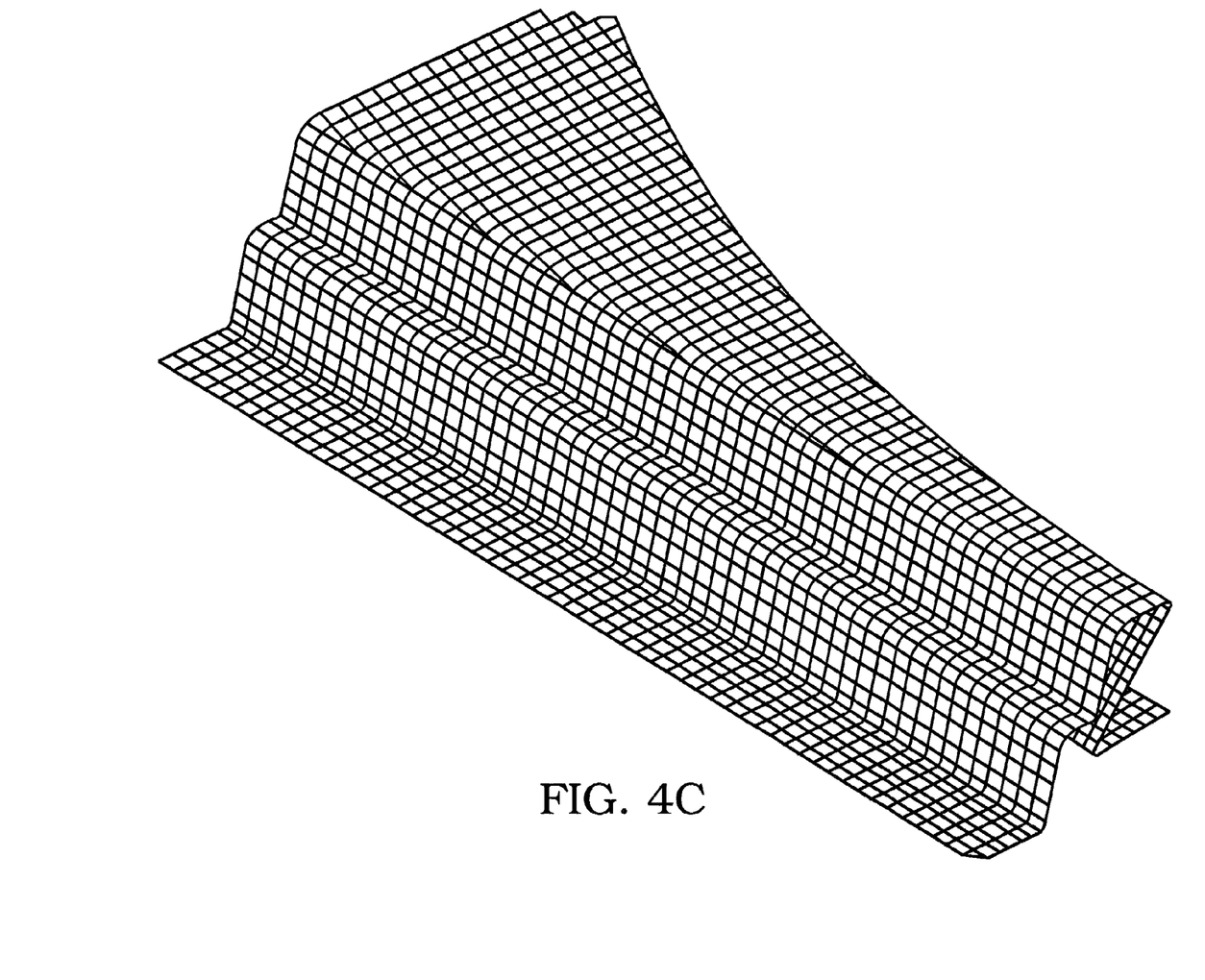
FIG. 4C shows the Budd Complex Channel that results from the simulation of FIGS. 4A and 4B.

FIG. 4B shows a detailed view of the switching activity which occurs early in the simulation. From FIG. 4B, it can be seen that the first implicit convergence trouble was detected at a simulation time of 0.0070 seconds. Method 200 automatically switched the simulation to the explicit method, and proceeded with this method until a simulation time of 0.0075 seconds. At this time, method 200 automatically switched the simulation back to the implicit method, however convergence trouble was again encountered. Method 200 automatically switched the simulation back to the explicit method, and proceeded to a simulation time of 0.0080 seconds. At this time, method 200 automatically switched the simulation again to the implicit method, which proceeded without convergence difficulty until simulation time 0.0090 seconds. Method 200 activated an automatic switch to the explicit method, and automatically returned to the implicit method at simulation time 0.0095 seconds, where the implicit method was again able to proceed without convergence trouble. Further convergence trouble was automatically detected at simulation times of 0.0155 seconds and 0.0200 seconds. Method 200 automatically applied switches to the explicit method once and thrice, respectively, to overcome these convergence difficulties. FIG. 4C shows the Budd Complex Channel that results from the simulation.

Figure 4D:
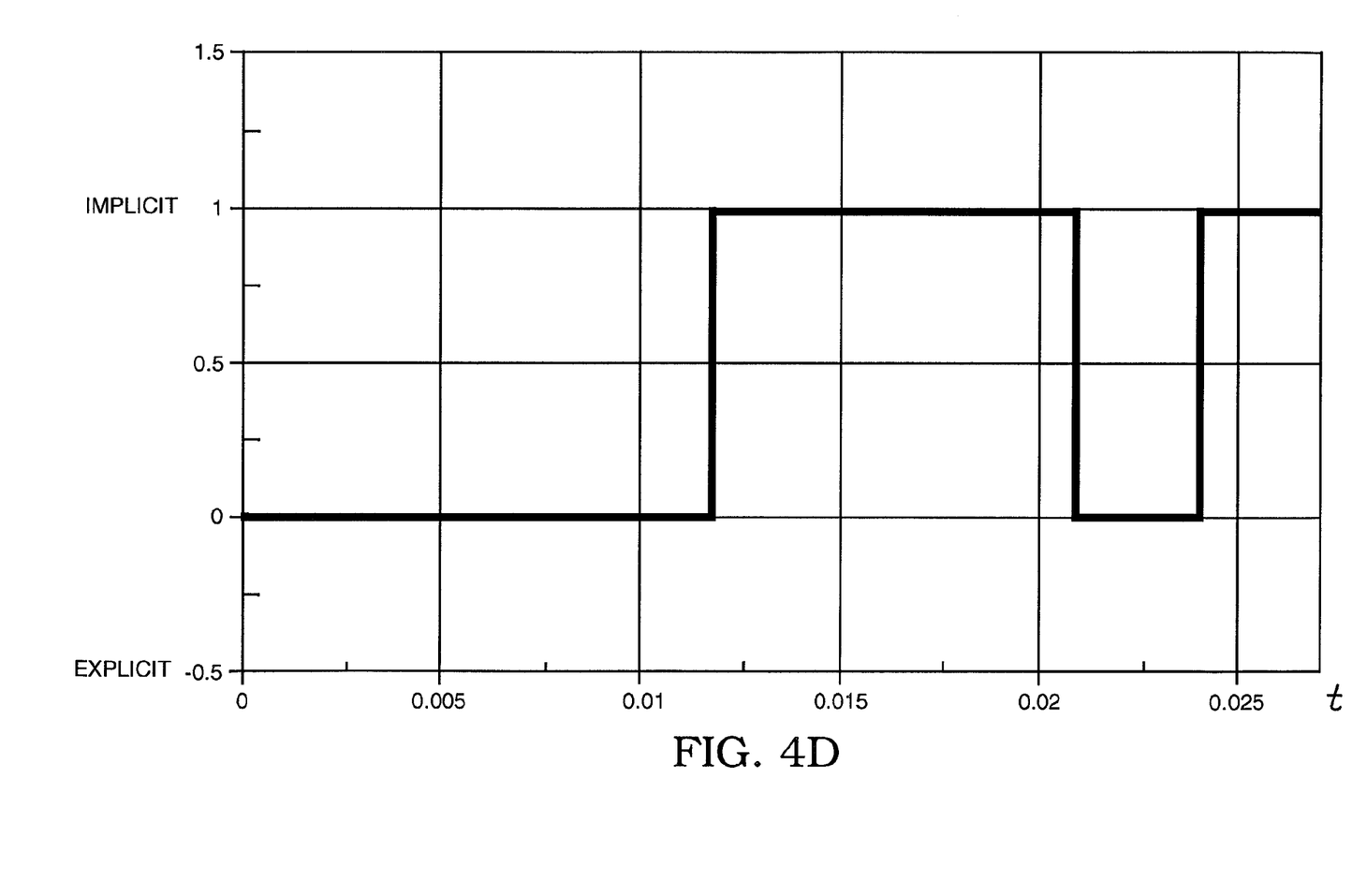
FIG. 4D shows a switching procedure that was discovered by trial-and-error using the manual switching method to solve a simulation of the formation of a Budd Complex Channel.

FIG. 4D shows a switching procedure that was manually generated using the present invention, as applied to a simulation of the formation of the Budd Complex Channel. In particular, FIG. 4D shows the manual switching scheme during the early stages of the Budd Channel forming simulation. This relatively simple switching scheme required over ten trial-and-error simulations to develop, as the simulation times for each of the three switches had to be discovered. Notice that the explicit method was used during the initial phase of the simulation, since a successful strategy which began with the implicit method could not be discovered by an experienced operator through a reasonable number of trial-and-error iterations.

Although both the manual and the automatic switching methods provide advantages over conventional implicit only or explicit only simulation techniques, the automatic switching method provides several benefits over the manual switching procedure. For example, the automatic switching method produces a solution much faster than that which could be obtained using the manual switching procedure. Using the automatic switching method, the Budd Complex Channel simulation was completed in approximately 31 CPU hours on an IBM RS-6000/260 workstation computer. Using the manual switching procedure, a similar simulation was completed in approximately 27 CPU hours on the same computer. However, the trial-and-error process of determining the switching scheme for the manual method involved more than ten failed simulations. Thus the total simulation time using the manual switching method, including the trial-and-error process, was approximately ten times larger than the total simulation time using the automatic switching method. The cost savings measured in terms of man-hours required to conduct the simulation was even more significant, since the trial-and-error process required by the manual switching method was extremely labor intensive, and required an experienced operator, while the switching procedure generated by the automatic switching method ran successfully on the first attempt without intervention by the operator.

Additionally, the automatic switching method produces a solution that is far more complex than that which could realistically be obtained using trial-and-error with the manual switching procedure. For example, the simulation of the Budd Complex channel using the automatic switching method involved fourteen switches between the implicit method and explicit method, while the manual switching scheme developed in over ten trial-and-error simulations included only three switches. FIG. 4D shows the switching scheme developed in the manual method, as compared to FIG. 4B for the automatic method. A complex solution using fourteen switches would have been virtually impossible to discover by trial-and-error using the manual switching procedure.

Figure 5A:
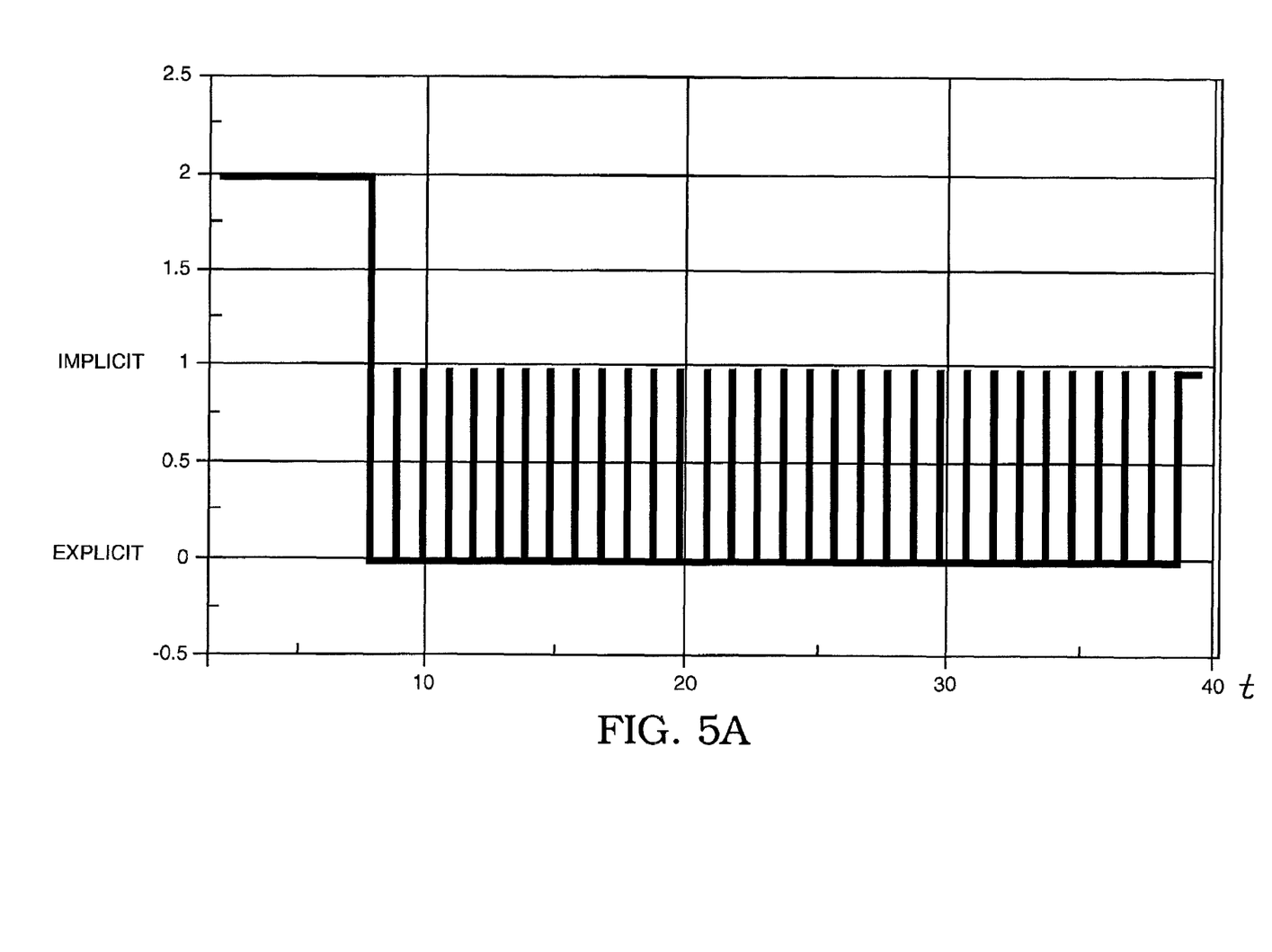
FIG. 5A shows a switching procedure that was automatically generated using a method of the present invention to solve a sheet metal springback simulation of the NUMISH-EET '93 U-Channel part.

FIG. 5A shows a switching procedure that was automatically created using method 300 to solve a sheet metal springback simulation of the NUMISHEET '93 U-Channel part. Springback is a problem that occurs when a stamped metal part is removed from formation tooling, and the part changes shape or deforms as internal stresses are relieved. Deformation due to springback creates a final part which no longer matches the shape of the tooling with which it was produced and, thus, is undesirable. Sheet metal parts which exhibit a large amount of deformation due to springback are typically very flexible. These types of parts are particularly challenging for the implicit method, and convergence of the equilibrium iteration process is inherently difficult. Thus, the implicit-explicit switch is ideally suited for springback simulation.

Referring to FIG. 5A, the y-axis (time step size) indicates which simulation method is employed: The implicit method uses a large time step (1.0 to 2.0 milliseconds), whereas the explicit method uses a small time step ($9.0 \times 10^{-4}$ milliseconds). During the simulation, the implicit method ran successfully during the first four time steps, but encountered convergence difficulty on the fifth time step. The fifth time step was an attempt advanced the solution to the original simulation end time of 10.0 milliseconds. The convergence failure was detected by method 300, and the explicit method was automatically activated for a duration of 1.0 milliseconds. Then the method 200 automatically switched back to the implicit method, and another implicit step was attempted. This step failed to converge also, so method 300 switched back to the explicit method and advanced the solution for a duration of 1.0 ms.

At this point the solution reached the original simulation end time, but since the current solution method was not implicit, method 300 automatically extended the end time by 1.0 milliseconds before switching back to the implicit method. This extension of the solution end time ensures that the last step of the simulation will be performed with the implicit method, and represents the fundamental difference between method 200 and method 300.

Several more automatic switches to the explicit method were performed, each for a duration of approximately 1.0 milliseconds, and each time returning to test for convergence with the implicit method. After a total of 31 switches, the part deformation had proceeded dynamically to a state which was close enough to the static equilibrium solution that the implicit method could finally converge, and the solution finished successfully.

Figure 5B:
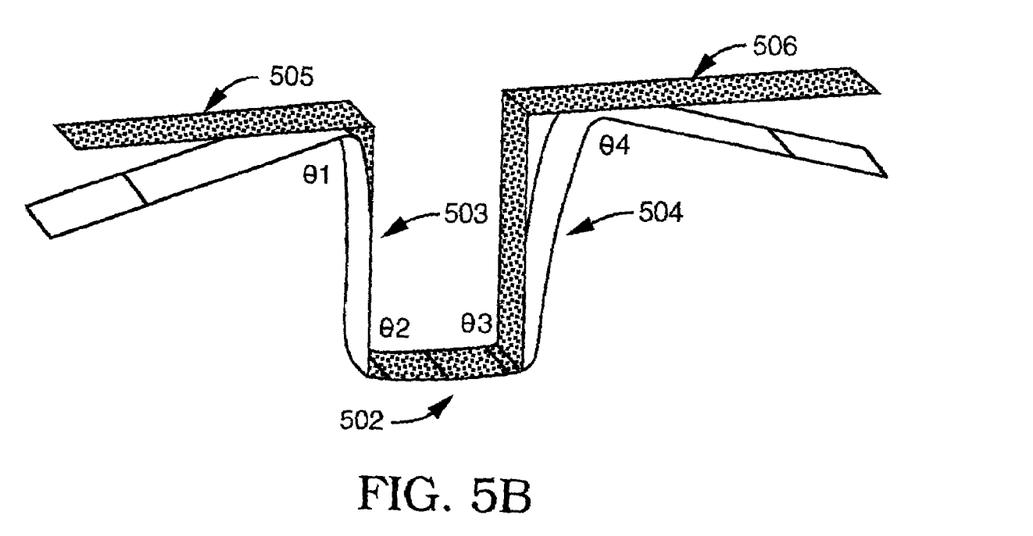
FIG. 5B shows the NUMISHEET '93 U-Channel part immediately after stamping (shaded portion) and after springback has occurred (unshaded portion).

The shaded portion of FIG. 5B shows the NUMISHEET '93 U-Channel part immediately after stamping or forming. The part geometry immediately after stamping includes four 90-degree angles $\theta 1$, $\theta 2$, $\theta 3$, and $\theta 4$, a horizontal center section 502, vertical sidewalls 503 and 504, and horizontal flanges 505 and 506. The unshaded portion of FIG. 5C shows the NUMISHEET '93 U-Channel part of FIG. 5B after springback has occurred (as simulated). After springback, $\theta 1$ is now less than 90 degrees, $\theta 2$ and $\theta 3$ are greater than 90 degrees, and $\theta 4$ is less than 90 degrees.

Advantages of the Present Invention

Performing finite element simulations using the implicit-explicit switching methods of the present invention provides several advantages over finite element simulation techniques. First, the manual and automatic implicit-explicit switching methods provide a way to capitalize on the strengths of the implicit method and the explicit method while minimizing the weaknesses of each method. Second, the automatic implicit-explicit switching method is a robust, automatic procedure which can obtain solutions which are very accurate and can be obtained with minimal operator interaction. Conventional simulation techniques often could not produce an accurate solution and required significant operator interaction.

While particular embodiments of the present invention and their advantages have been shown and described, it should be understood that various changes, substitutions, and alterations can be made therein without departing from the spirit and scope of the invention as defined by the appended claims. For example, although it has been described how the present invention can be used in formation simulations and springback simulations, those skilled in the art will recognize that the present invention can be applied to a wide variety of problems relating to non-linear static or dynamic analysis using the finite element method, such as general structural mechanics and stress analysis, fluid mechanics, biomechanics, heat transfer, geomechanics, aeromechanics, chemical reactions, acoustics, and electric and magnetic fields. As another example, methods 200 and 300 can begin using the explicit method rather than the implicit method.

What is claimed is:

1. A computer implemented method of simulating the effect of a load or other influence on a system based upon solving transient dynamic equations and obtaining static equilibrium solutions, the method comprising performing a finite element simulation comprising automatically switching between an implicit method of analyzing the effect of the load or other influence and an explicit method of analyzing the effect of the load or other influence two or more times during the finite element simulation.

2. The method of claim 1 further comprising beginning the finite element simulation using the implicit method.

3. The method of claim 1 further comprising beginning the finite element simulation using the explicit method.

4. The method of claim 1 further comprising ending the finite element simulation if a solution to the finite element simulation is determined using the implicit method.

5. The method of claim 1 further comprising ending the finite element simulation if a solution to the finite element simulation is determined using the explicit method.

6. The method of claim 1 further comprising monitoring a number of iterations performed using the implicit method and automatically switching from the implicit method to the explicit method if the number of iterations exceeds a predetermined threshold number.

7. The method of claim 1 further comprising monitoring the internal energy of the model during iterations of the implicit method and automatically switching from the implicit method to the explicit method if the internal energy exceeds a predetermined threshold number.

8. The method of claim 1 further comprising monitoring a length of time the explicit method has been running and automatically switching from the explicit method back to the implicit method if the length of time exceeds a predetermined threshold time period.

9. The method of claim 1 further comprising extending the termination time of the finite element simulation thereby forcing the finite element simulation to end using the implicit method.

10. The method of claim 1 wherein the finite element simulation is used to simulate the formation of a metal shape.

11. The method of claim 1 wherein the finite element simulation is used to simulate the springback of a metal shape.

12. A computer readable storage medium storing one or more computer programs for simulating the effect of a load or other influence on a part by performing a finite element simulation, the computer programs comprising instructions for:
constructing a finite element simulation of the part;
analyzing the effect of the load upon the simulated part with an implicit method of solution;
analyzing the effect of the load upon the simulated part with an explicit method of solution; and
automatically switching between the implicit solution method of analyzing the effect of the load upon the simulated part and the explicit solution method of analyzing the effect of the load upon the simulated part two or more times during the finite element simulation.

13. The computer readable storage medium of claim 12 wherein the computer programs further comprise computer instructions for beginning the finite element simulation using the implicit method.

14. The computer readable storage medium of claim 12 wherein the computer programs further comprise computer instructions for beginning the finite element simulation using the explicit method.

15. The computer readable storage medium of claim 12 wherein the computer programs further comprise computer instructions for ending the finite element simulation if a solution to the finite element simulation is determined using the implicit method.

16. The computer readable storage medium of claim 12 wherein the computer programs further comprise computer instructions for ending the finite element simulation if a solution to the finite element simulation is determined using the explicit method.

17. The computer readable storage medium of claim 12 wherein the computer programs further comprise computer instructions for monitoring a number of iterations performed using the implicit method and automatically switching from the implicit method to the explicit method if the number of iterations exceeds a predetermined threshold number.

18. The computer readable storage medium of claim 12 wherein the computer programs further comprise computer instructions for monitoring the internal energy of the model during iterations using the implicit method and automatically switching from the implicit method to the explicit method if the internal energy exceeds a predetermined threshold number.

19. The computer readable storage medium of claim 12 wherein the computer programs further comprise computer instructions for monitoring a length of time the explicit method has been running and automatically switching from the explicit method back to the implicit method if the length of time exceeds a predetermined threshold time period.

20. The computer readable storage medium of claim 12 wherein the computer programs further comprise computer instructions for extending the termination time of the finite element simulation thereby forcing the finite element simulation to end using the implicit method.

21. The computer readable storage medium of claim 12 wherein the finite element simulation is used to simulate the formation of a metal shape.

22. The computer readable storage medium of claim 12 wherein the finite element simulation is used to simulate the springback of a metal shape.

23. A computer system comprising:
one or more computers; and
one or more computer programs running on the computer(s), the computer programs for performing a finite element simulation, the computer programs comprising computer instructions for automatically switching between an implicit finite element simulation method and an explicit finite element simulation method two or more times during the finite element simulation.

24. The computer system of claim 23 wherein the computer programs further comprise computer instructions for beginning the finite element simulation using the implicit method.

25. The computer system of claim 23 wherein the computer programs further comprise computer instructions for beginning the finite element simulation using the explicit method.

26. The computer system of claim 23 wherein the computer programs further comprise computer instructions for ending the finite element simulation if a solution to the finite element simulation is determined using the implicit method.

27. The computer system of claim 23 wherein the computer programs further comprise computer instructions for ending the finite element simulation if a solution to the finite element simulation is determined using the explicit method.

28. The computer system of claim 23 wherein the computer programs further comprise computer instructions for monitoring a number of iterations performed using the implicit method and automatically switching from the implicit method to the explicit method if the number of iterations exceeds a predetermined threshold number.

29. The computer system of claim 23 wherein the computer programs further comprise computer instructions for monitoring the internal energy of the model during iterations of the implicit method and automatically switching from the implicit method to the explicit method if the internal energy exceeds a predetermined threshold number.

30. The computer system of claim 23 wherein the computer programs further comprise computer instructions for monitoring a length of time the explicit method has been running and automatically switching from the explicit method back to the implicit method if the length of time exceeds a predetermined threshold time period.

31. The computer system of claim 23 wherein the computer programs further comprise computer instructions for extending the termination time of the finite element simulation if a solution is found using the explicit method thereby forcing the finite element simulation to end using the implicit method.

32. The computer system of claim 23 wherein the finite element simulation is used to simulate the formation of a metal shape.

33. The computer system of claim 23 wherein the finite element simulation is used to simulate the springback of a metal shape.

34. A computer readable storage medium, the computer readable storage medium including one or more computer programs for performing a finite element simulation, the computer programs comprising:
instructions for automatically switching between an implicit method and an explicit method one or more times during the finite element simulation, and
instructions for monitoring the internal energy of the model during iterations using the implicit method and automatically switching from the implicit method to the explicit method if the internal energy exceeds a predetermined threshold number.

35. The computer readable storage medium of claim 34 wherein the computer programs further comprise computer instructions for beginning the finite element simulation using the implicit method.

36. The computer readable storage medium of claim 34 wherein the computer programs further comprise computer instructions for beginning the finite element simulation using the explicit method.

37. The computer readable storage medium of claim 34 wherein the computer programs further comprise computer instructions for ending the finite element simulation if a solution to the finite element simulation is determined using the implicit method.

38. The computer readable storage medium of claim 34 wherein the computer programs further comprise computer instructions for ending the finite element simulation if a solution to the finite element simulation is determined using the explicit method.

39. The computer readable storage medium of claim 34 wherein the computer programs further comprise computer instructions for monitoring a number of iterations performed using the implicit method and automatically switching from the implicit method to the explicit method if the number of iterations exceeds a predetermined threshold number.

40. The computer readable storage medium of claim 34 wherein the computer programs further comprise computer instructions for monitoring a length of time the explicit method has been running and automatically switching from the explicit method back to the implicit method if the length of time exceeds a predetermined threshold time period.

41. The computer readable storage medium of claim 34 wherein the computer programs further comprise computer instructions for extending the termination time of the finite element simulation thereby forcing the finite element simulation to end using the implicit method.

42. The computer readable storage medium of claim 34 wherein the finite element simulation is used to simulate the formation of a metal shape.

43. The computer readable storage medium of claim 34 wherein the finite element simulation is used to simulate the springback of a metal shape.

* * * * *